(12) United States Patent
Ding et al.

(10) Patent No.: US 11,088,231 B2
(45) Date of Patent: Aug. 10, 2021

(54) ORGANIC LIGHT EMITTING DIODE DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Wu Ding, Hubei (CN); Songshan Li, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 16/467,994

(22) PCT Filed: Nov. 22, 2018

(86) PCT No.: PCT/CN2018/116985
§ 371 (c)(1),
(2) Date: Jun. 10, 2019

(87) PCT Pub. No.: WO2020/077737
PCT Pub. Date: Apr. 23, 2020

(65) Prior Publication Data
US 2020/0203454 A1    Jun. 25, 2020

(30) Foreign Application Priority Data

Oct. 18, 2018 (CN) .......................... 201811213431.0

(51) Int. Cl.
*H01L 27/32* (2006.01)
*H01L 51/56* (2006.01)

(52) U.S. Cl.
CPC ...... *H01L 27/3258* (2013.01); *H01L 27/3246* (2013.01); *H01L 51/56* (2013.01); *H01L 2227/323* (2013.01)

(58) Field of Classification Search
None
See application file for complete search history.

(56) References Cited

U.S. PATENT DOCUMENTS

2002/0154252 A1* 10/2002 Toyota .............. G02F 1/136227
349/38
2004/0241920 A1    12/2004 Hsiao et al.
(Continued)

FOREIGN PATENT DOCUMENTS

| CN | 1622297 A | 6/2005 |
|----|-----------|--------|
| CN | 107706224 A | 2/2018 |
| CN | 107706243 A | 2/2018 |

*Primary Examiner* — Moazzam Hossain
*Assistant Examiner* — Stanetta D Isaac
(74) *Attorney, Agent, or Firm* — Mark M. Friedman

(57) ABSTRACT

An organic light emitting diode (OLED) display panel and manufacturing method thereof are provided. The display panel includes a substrate, a thin film transistor layer, and a light emitting structure, wherein the thin film transistor layer includes a polysilicon layer, a gate dielectric layer positioned on the polysilicon layer, a gate metal layer positioned on the gate dielectric layer, a gate buffer layer positioned on the gate dielectric layer, and an interlayer dielectric layer covering the gate dielectric layer, the gate metal layer, and the gate buffer layer.

10 Claims, 2 Drawing Sheets

(56) References Cited

U.S. PATENT DOCUMENTS

2016/0211281 A1* 7/2016 Ryu .................. H01L 27/127
2018/0151831 A1* 5/2018 Lee .................. H01L 27/3262
2019/0088787 A1   3/2019 Li
2019/0393289 A1* 12/2019 Hu .................. H01L 27/3246

* cited by examiner

ORGANIC LIGHT EMITTING DIODE DISPLAY PANEL AND MANUFACTURING METHOD THEREOF

CROSS REFERENCE TO RELATED APPLICATION

This application claims the priority of International Application No. PCT/CN2018/116985, filed on 2018 Nov. 22, which claims priority to Chinese Application No. 201811213431.0, filed on 2018 Oct. 18. The entire disclosures of each of the above applications are incorporated herein by reference.

BACKGROUND OF INVENTION

Field of Invention

The present invention relates to the field of display technologies, and in particular, to an organic light emitting diode display panel and manufacturing method thereof.

Description of Prior Art

In the manufacture process of the thin film transistor in a conventional organic light emitting diode (OLED) display panel, an interlayer dielectric layer is deposited by plasma-enhanced chemical vapor deposition (PECVD) after the gate metal is completed. At present, the gate metal is usually made of molybdenum (Mo), and the interlayer dielectric layer is usually made of a laminate of silicon oxide (SiOx) and silicon nitride (SiNx).

Technical Problems

Since there is a large degree of difference regarding material properties of molybdenum and silicon oxide, there is often a large stress at their interface, whereby molybdenum and silicon oxide cannot be tightly bonded. The stress between them even causes the interlayer dielectric layer to fall off, and generate a gap between the gate metal and the interlayer dielectric layer, thereby seriously affecting the characteristics of the thin film transistor, and seriously affecting the yield of the device.

SUMMARY OF THE INVENTION

Technical Solutions

The present invention provides an organic light emitting diode display panel and manufacturing method thereof, which could solve the technical problem of the film layer falling off due to the stress between the interlayer dielectric layer and the gate metal in the prior art.

In order to solve the above problems, the present invention provides an organic light emitting diode (OLED) display panel, wherein the display panel includes a substrate, a thin film transistor layer positioned on the substrate, and a light emitting structure positioned on the thin film transistor layer and connected to a source/drain region trace layer in the thin film transistor layer;

wherein the thin film transistor layer includes:

a polysilicon layer positioned on the substrate, the polysilicon layer has heavily doped source/drain regions spaced from each other a distance and a lightly doped channel region located between the source/drain regions;

a gate dielectric layer positioned on the polysilicon layer;

a gate metal layer positioned on the gate dielectric layer, the gate metal layer only covering the gate dielectric layer over the channel region;

a gate buffer layer positioned on the gate dielectric layer; and an interlayer dielectric layer covering the gate dielectric layer, the gate metal layer, and the gate buffer layer;

wherein the source/drain region trace layer penetrates through the gate dielectric layer and the interlayer dielectric layer; and wherein a material constituting the gate buffer layer is an oxide of the gate metal layer, and by oxidizing the gate metal layer, the oxide is formed on a top of the gate metal layer to form the gate buffer layer.

According to one aspect of the invention, a material of the gate metal layer is molybdenum, and the material constituting the gate buffer layer is molybdenum oxide.

According to one aspect of the invention, the interlayer dielectric layer includes a first dielectric layer and a second dielectric layer, and wherein a material of the first dielectric layer is silicon oxide, the second dielectric layer is positioned on the first dielectric layer, and a material of the second dielectric layer is silicon nitride.

In order to solve the above problems, the present invention provides an organic light emitting diode (OLED) display panel, wherein the display panel includes a substrate, a thin film transistor layer positioned on the substrate, and a light emitting structure positioned on the thin film transistor layer and connected to a source/drain region trace layer in the thin film transistor layer;

wherein the thin film transistor layer includes:

a polysilicon layer positioned on the substrate, the polysilicon layer has heavily doped source/drain regions spaced from each other a distance and a lightly doped channel region located between the source/drain regions;

a gate dielectric layer positioned on the polysilicon layer;

a gate metal layer positioned on the gate dielectric layer, the gate metal layer only covering the gate dielectric layer over the channel region;

a gate buffer layer positioned on the gate dielectric layer; and an interlayer dielectric layer covering the gate dielectric layer, the gate metal layer, and the gate buffer layer;

wherein the source/drain region trace layer penetrates through the gate dielectric layer and the interlayer dielectric layer.

According to one aspect of the invention, a material constituting the gate buffer layer is an oxide of the gate metal layer, and by oxidizing the gate metal layer, the oxide is formed on a top of the gate metal layer to form the gate buffer layer.

According to one aspect of the invention, a material of the gate metal layer is molybdenum, and the material constituting the gate buffer layer is molybdenum oxide.

According to one aspect of the invention, the interlayer dielectric layer includes a first dielectric layer and a second dielectric layer, and wherein a material of the first dielectric layer is silicon oxide, the second dielectric layer is positioned on the first dielectric layer, and a material of the second dielectric layer is silicon nitride.

According to one aspect of the invention, the gate buffer layer has a thickness of 2 to 5 nm.

In order to solve the above problems, the present invention provides a method of manufacturing an organic light emitting diode (OLED) display panel, wherein the method includes the steps of:

providing a substrate;

forming a polysilicon layer positioned on the substrate, forming heavily doped source/drain regions in the polysilicon layer, the source/drain regions being spaced from each other a distance, and a lightly doped channel region in the polysilicon layer and between the source/drain regions;

forming a gate dielectric layer positioned on the polysilicon layer;

forming a gate metal layer positioned on the gate dielectric layer, the gate metal layer only covering the gate dielectric layer over the channel region;

forming a gate buffer layer positioned on the gate dielectric layer;

forming an interlayer dielectric layer covering the gate dielectric layer, the gate metal layer, and the gate buffer layer;

forming a source/drain region trace layer penetrating through the gate dielectric layer and the interlayer dielectric layer; and forming a light emitting structure connected to the source/drain region trace layer.

According to one aspect of the invention, a material constituting the gate buffer layer is an oxide of the gate metal layer, and by oxidizing the gate metal layer, the oxide is formed on a top of the gate metal layer to form the gate buffer layer.

According to one aspect of the invention, a material of the gate metal layer is molybdenum, and the material constituting the gate buffer layer is molybdenum oxide.

According to one aspect of the invention, the interlayer dielectric layer includes a first dielectric layer and a second dielectric layer, and wherein a material of the first dielectric layer is silicon oxide, the second dielectric layer is positioned on the first dielectric layer, and a material of the second dielectric layer is silicon nitride.

According to one aspect of the invention, the gate buffer layer has a thickness of 2 to 5 nm.

Advantageous Effects

The present invention improves the existing thin film transistor of the organic light emitting diode display panel and the manufacturing method thereof. After the gate metal (molybdenum) is completed, a thin layer of dense molybdenum oxide of about 2 to 5 nm is formed as a gate buffer layer over the gate dielectric layer by oxidation, and then an interlayer dielectric layer is deposited. Since the surface tension of the molybdenum oxide is between the surface tension of the molybdenum and the surface tension of the interlayer dielectric layer, the molybdenum oxide can effectively reduce the interface stress between the gate metal and the interlayer dielectric layer to prevent the occurrence of falling off after deposition of the interlayer dielectric layer, whereby the characteristics of the thin film transistor can be improved, and the yield of the device can be greatly increased.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

Figure 1:
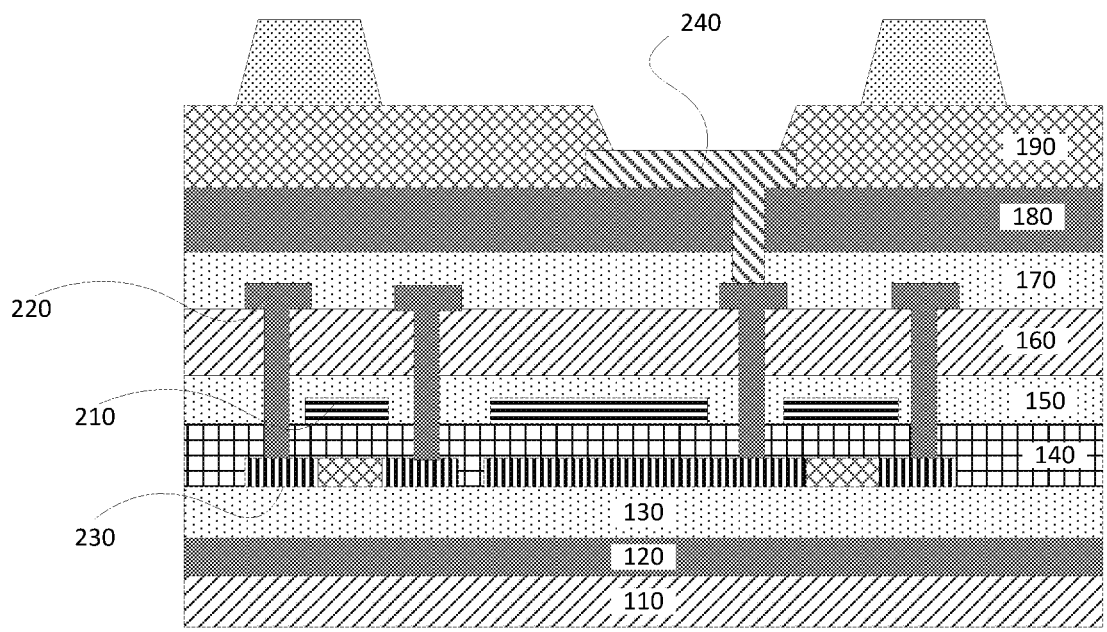
FIG. 1 is a structure diagram of a thin film transistor in an organic light emitting diode display panel in the prior art.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

First, the prior art is briefly described. Referring to FIG. 1, a thin film transistor layer of an organic light emitting diode display panel of prior art includes a substrate 110, a silicon nitride layer 120, a silicon oxide layer 130, a polysilicon layer 140, a gate metal 210, and a first interlayer dielectric layer 150, a second interlayer dielectric layer 160, source/drain metal traces 220, a first insulating layer 170, a second insulating layer 180, an anode metal 240, and a pixel defining layer 190.

The substrate 110 is usually a rigid substrate such as glass, or a flexible substrate such as a polyimide substrate.

The silicon nitride layer 120 is located on the substrate 110, and the silicon oxide layer 130 is located on the silicon nitride layer 120.

The polysilicon layer 140 is located on the silicon oxide layer 130, and the polysilicon layer 140 includes a heavily doped source and drain regions 230 and a channel region between the source and drain regions 230.

The gate metal 210 is located on the polysilicon layer 140, and the gate metal 210 covers the polysilicon layer 140 above the channel region.

The first interlayer dielectric layer 150 is located on the polysilicon layer 140, and the first interlayer dielectric layer 150 covers the gate metal 210 and the polysilicon layer 140 not covered by the gate metal 210.

The second interlayer dielectric layer 160 is located on the first interlayer dielectric layer 150.

The source/drain metal traces 220 extend through the first interlayer dielectric layer 150 and the second interlayer dielectric layer 160.

The first insulating layer 170 covers the source/drain metal traces 220 and the second interlayer dielectric layer 160.

The second insulating layer 180 is located on the first insulating layer 170.

The anode metal 240 penetrates the first insulating layer 170 and the second insulating layer 180.

The pixel defining layer 190 is located on the anode metal 240 and has a communication hole connected to the anode metal 240.

In the prior art, the gate metal is usually made of molybdenum (Mo), and the interlayer dielectric layer is usually made of a laminate of silicon oxide (SiOx) and silicon nitride (SiNx). Since there are many differences in material properties between molybdenum and silicon oxide, there is often a large stress at their interface, therefore molybdenum and silicon oxide cannot be tightly bonded. The stress between them even causes the interlayer dielectric layer to fall off, and generates a gap between the gate metal and the interlayer dielectric layer, thereby seriously affecting the characteristics of the thin film transistor, and seriously affecting the yield of the device.

Therefore, the present invention provides an organic light emitting diode display panel and manufacturing method thereof, which could solve the technical problem of the falling off of the film layer due to the interface stress between the interlayer dielectric layer and the gate metal in the prior art.

The present invention provides an organic light emitting diode (OLED) display panel, wherein the display panel includes a substrate 110, a silicon nitride layer 120, a silicon oxide layer 130, a polysilicon layer 140, a gate metal 210, a gate buffer layer 210a, a first interlayer dielectric layer 150, a second interlayer dielectric layer 160, source/drain metal traces 220, a first insulating layer 170, a second insulating layer 180, an anode metal 240, a pixel defining layer 190, and a light emitting structure over the pixel defining layer 190. The polysilicon layer 140, the gate metal 210, the first interlayer dielectric layer 150, the second interlayer dielectric layer 160, and the source/drain metal traces 220 constitute a thin film transistor layer.

The substrate 110 is usually a rigid substrate such as glass, or a flexible substrate such as a polyimide substrate.

The silicon nitride layer 120 is located on the substrate 110, and the silicon oxide layer 130 is located on the silicon nitride layer 120.

The polysilicon layer 140 is located on the silicon oxide layer 130, and the polysilicon layer 140 includes heavily doped source and drain regions 230 and a channel region between the source and drain regions 230.

The gate metal 210 is located on the polysilicon layer 140, and the gate metal 210 covers the polysilicon layer 140 above the channel region.

The gate buffer layer 210a is located on the gate metal 210, the material constituting the gate buffer layer 210a is an oxide of the gate metal layer 210, and by oxidizing the gate metal layer, a corresponding oxide is formed on the top thereof to constitute a gate buffer layer. Preferably, the material constituting the gate metal layer is molybdenum, and the material constituting the gate buffer layer is molybdenum oxide. Preferably, the gate buffer layer has a thickness of 2 to 5 nm.

The first interlayer dielectric layer 150 is located on the polysilicon layer 140, and the material thereof is silicon oxide. The first interlayer dielectric layer 150 covers the gate metal 210 and the polysilicon layer 140 that is not covered by the gate metal 210.

The second interlayer dielectric layer 160 is located on the first interlayer dielectric layer 150, and the material thereof is silicon nitride.

The source/drain metal traces 220 extend through the first interlayer dielectric layer 150 and the second interlayer dielectric layer 160.

The first insulating layer 170 covers the source/drain metal traces 220 and the second interlayer dielectric layer 160.

The second insulating layer 180 is located on the first insulating layer 170.

The anode metal 240 penetrates the first insulating layer 170 and the second insulating layer 180.

The pixel defining layer 190 is located on the anode metal 240 and has a communication hole connected to the anode metal 240.

In the present invention, after the gate metal (molybdenum) is completed, a thin layer of dense molybdenum oxide of about 2 to 5 nm is formed as a gate buffer layer over the gate dielectric layer by oxidation, and then an interlayer dielectric layer is deposited. Since the surface tension of the molybdenum oxide is between the surface tension of the molybdenum and the surface tension of the interlayer dielectric layer, the molybdenum oxide can effectively reduce the interface stress between the gate metal and the interlayer dielectric layer to prevent the occurrence of falling off after deposition of the interlayer dielectric layer, whereby the characteristics of the thin film transistor can be improved, and the yield of the device can be greatly increased.

The present invention also provides a method of manufacturing an organic light emitting diode (OLED) display panel, wherein the method includes the steps of:

providing a substrate;

forming a polysilicon layer positioned on the substrate, forming heavily doped source/drain regions in the polysilicon layer, the source/drain regions being spaced from each other a distance, and a lightly doped channel region in the polysilicon layer and between the source/drain regions;

forming a gate dielectric layer positioned on the polysilicon layer;

forming a gate metal layer positioned on the gate dielectric layer, the gate metal layer only covering the gate dielectric layer over the channel region;

forming a gate buffer layer positioned on the gate dielectric layer;

forming an interlayer dielectric layer covering the gate dielectric layer, the gate metal layer, and the gate buffer layer;

forming a source/drain region trace layer penetrating through the gate dielectric layer and the interlayer dielectric layer; and forming a light emitting structure connected to the source/drain region trace layer.

Figure 2:
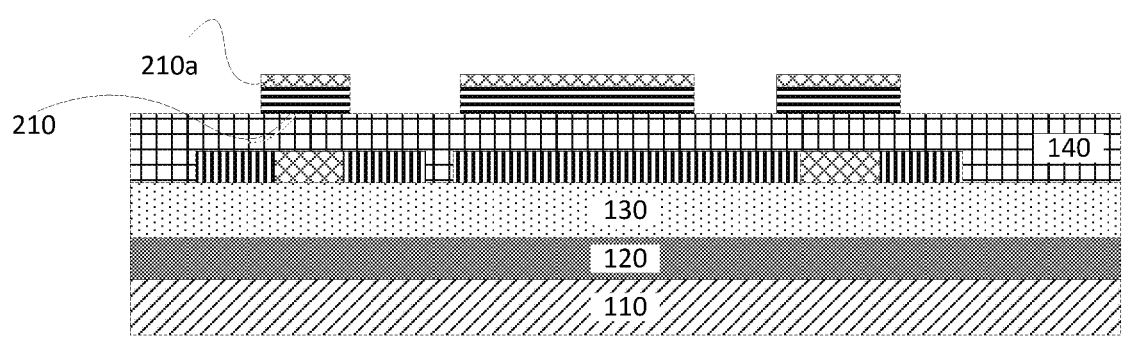
FIG. 2 to FIG. 4 are structure diagrams showing the structure of a thin film transistor in each step of a method for manufacturing an organic light emitting diode display panel according to an embodiment of the present invention.

The above method will be described in detail below with reference to the accompanying drawings. First, referring to FIG. 2, a substrate 110 is provided, and a silicon nitride layer 120, a silicon oxide layer 130, a polysilicon layer 140, a gate metal 210, and a gate buffer layer 210a are sequentially formed on the substrate 110.

The substrate 110 is usually a rigid substrate such as glass, or a flexible substrate such as a polyimide substrate.

The silicon nitride layer 120 is located above the substrate 110, and the silicon oxide layer 130 is located on the silicon nitride layer 120.

The polysilicon layer 140 is located on the silicon oxide layer 130, and the polysilicon layer 140 includes a heavily doped source and drain regions 230 and a channel region between the source and drain regions 230.

The gate metal 210 is located on the polysilicon layer 140, and the gate metal 210 covers the polysilicon layer 140 above the channel region.

The gate buffer layer 210a is located on the gate metal 210, the material constituting the gate buffer layer 210a is an oxide of the gate metal layer 210, and by oxidizing the gate metal layer, a corresponding oxide is formed on the top thereof to constitute a gate buffer layer. Preferably, the material constituting the gate metal layer is molybdenum, and the material constituting the gate buffer layer is molybdenum oxide. Preferably, the gate buffer layer has a thickness of 2 to 5 nm.

Figure 3:
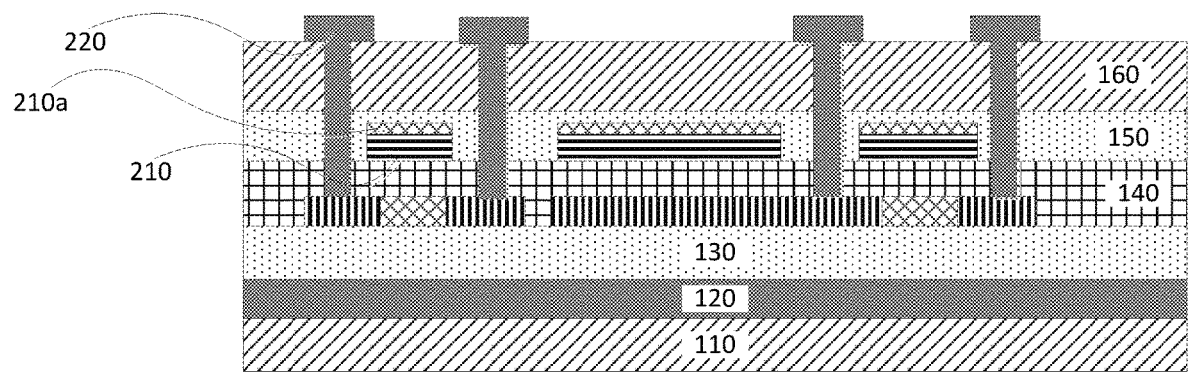

Referring to FIG. 3, after the gate buffer layer 210a is deposited, a first interlayer dielectric layer 150, a second interlayer dielectric layer 160, and source/drain metal traces 220 are sequentially formed thereon.

The first interlayer dielectric layer 150 is located on the polysilicon layer 140, and the material thereof is silicon oxide. The first interlayer dielectric layer 150 covers the gate metal 210 and the polysilicon layer 140 that is not covered by the gate metal 210.

The second interlayer dielectric layer 160 is located on the first interlayer dielectric layer 150, and the material thereof is silicon nitride.

The source/drain metal traces 220 extend through the first interlayer dielectric layer 150 and the second interlayer dielectric layer 160.

Figure 4:
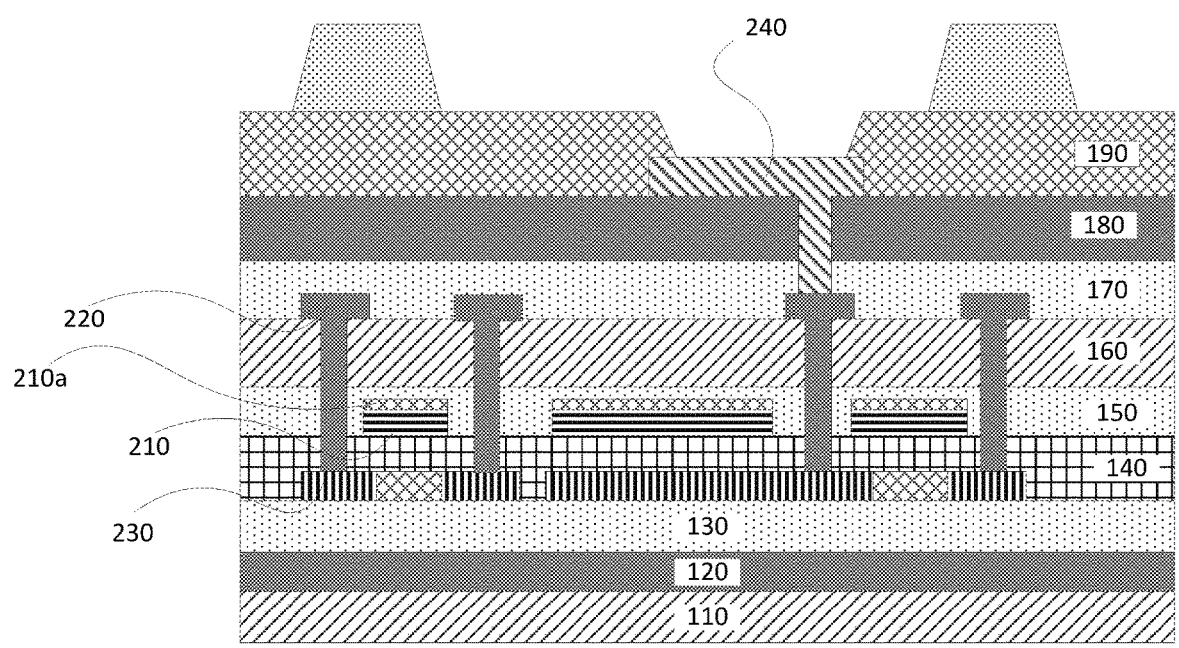

After that, see FIG. 4, a first insulating layer 170, a second insulating layer 180, an anode metal 240, a pixel defining layer 190, and a light emitting structure over the pixel defining layer 190 are sequentially formed after the source/drain metal traces 220 are formed.

The first insulating layer 170 covers the source/drain metal traces 220 and the second interlayer dielectric layer 160.

The second insulating layer 180 is located on the first insulating layer 170.

The anode metal 240 penetrates the first insulating layer 170 and the second insulating layer 180.

The pixel defining layer 190 is located on the anode metal 240 and has a communication hole connected to the anode metal 240.

In the present invention, the technique of forming the substrate 110, the silicon nitride layer 120, the silicon oxide layer 130, the polysilicon layer 140, the gate metal 210, the gate buffer layer 210a, the first interlayer dielectric layer 150, the second interlayer dielectric layer 160, the source/drain metal trace 220, the first insulating layer 170, the second insulating layer 180, the anode metal 240, the pixel defining layer 190, and the light emitting structure over the pixel defining layer 190 is a mature process in the art and will not be described in detail herein.

The present invention improves the thin film transistor of the existing organic light emitting diode display panel and the manufacturing method thereof. After the gate metal molybdenum is completed, a thin layer of dense molybdenum oxide of about 2 to 5 nm is formed as a gate buffer layer over the gate dielectric layer by oxidation, and then an interlayer dielectric layer is deposited. Since the surface tension of the molybdenum oxide is between the surface tension of the molybdenum and the surface tension of the interlayer dielectric layer, the interface stress between the molybdenum and the interlayer dielectric layer can be well lowered to prevent the occurrence of falling off after deposition of the interlayer dielectric layer, whereby the characteristics of the thin film transistor can be improved, and the yield of the device can be greatly increased.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. An organic light emitting diode (OLED) display panel, wherein the display panel comprises a substrate, a thin film transistor layer positioned on the substrate, and a light emitting structure positioned on the thin film transistor layer and connected to a source/drain region trace layer in the thin film transistor layer;

wherein the thin film transistor layer comprises:

a polysilicon layer positioned on the substrate, the polysilicon layer has heavily doped source/drain regions spaced from each other a distance and a lightly doped channel region located between the source/drain regions;

a gate dielectric layer positioned on the polysilicon layer;

a gate metal layer positioned on the gate dielectric layer, the gate metal layer only covering the gate dielectric layer over the channel region, wherein a material of the gate metal layer is molybdenum;

a gate buffer layer positioned on the gate dielectric layer, wherein a material of the gate buffer layer is molybdenum oxide; and an interlayer dielectric layer covering the gate dielectric layer, the gate metal layer, and the gate buffer layer;

wherein the source/drain region trace layer penetrates through the gate dielectric layer and the interlayer dielectric layer; and wherein a material constituting the gate buffer layer is an oxide of the gate metal layer, and by oxidizing the gate metal layer, the oxide is formed on a top of the gate metal layer to form the gate buffer layer.

2. The OLED display panel according to claim 1, wherein the interlayer dielectric layer comprises a first interlayer dielectric layer and a second interlayer dielectric layer, and wherein a material of the first interlayer dielectric layer is silicon oxide, the second interlayer dielectric layer is positioned on the first dielectric layer, and a material of the second interlayer dielectric layer is silicon nitride.

3. An organic light emitting diode (OLED) display panel, wherein the display panel comprises a substrate, a thin film transistor layer positioned on the substrate, and a light emitting structure positioned on the thin film transistor layer and connected to a source/drain region trace layer in the thin film transistor layer;

wherein the thin film transistor layer comprises:

a polysilicon layer positioned on the substrate, the polysilicon layer has heavily doped source/drain regions spaced from each other a distance and a lightly doped channel region located between the source/drain regions;

a gate dielectric layer positioned on the polysilicon layer;

a gate metal layer positioned on the gate dielectric layer, the gate metal layer only covering the gate dielectric layer over the channel region, wherein a material of the gate metal layer is molybdenum;

a gate buffer layer positioned on the gate dielectric layer, wherein a material of the gate buffer layer is molybdenum oxide; and an interlayer dielectric layer covering the gate dielectric layer, the gate metal layer, and the gate buffer layer;

wherein the source/drain region trace layer penetrates through the gate dielectric layer and the interlayer dielectric layer.

4. The OLED display panel according to claim 3, wherein a material of the gate metal layer is molybdenum, and the material constituting the gate buffer layer is molybdenum oxide.

5. The OLED display panel according to claim 3, wherein the interlayer dielectric layer comprises a first interlayer dielectric layer and a second interlayer dielectric layer, and wherein a material of the first interlayer dielectric layer is silicon oxide, the second interlayer dielectric layer is positioned on the first interlayer dielectric layer, and a material of the second interlayer dielectric layer is silicon nitride.

6. The OLED display panel according to claim 3, wherein the gate buffer layer has a thickness of 2 to 5 nm.

7. A method of manufacturing an organic light emitting diode (OLED) display panel, wherein the method comprises the steps of:

providing a substrate;

forming a polysilicon layer positioned on the substrate, forming heavily doped source/drain regions in the polysilicon layer, the source/drain regions being spaced from each other a distance, and a lightly doped channel region in the polysilicon layer and between the source/drain regions;

forming a gate dielectric layer positioned on the polysilicon layer;

forming a gate metal layer positioned on the gate dielectric layer, the gate metal layer only covering the gate dielectric layer over the channel region, wherein a material of the gate metal layer is molybdenum;

forming a gate buffer layer positioned on the gate dielectric layer, wherein a material of the gate buffer layer is molybdenum oxide;

forming an interlayer dielectric layer covering the gate dielectric layer, the gate metal layer, and the gate buffer layer; and forming a source/drain region trace layer penetrating through the gate dielectric layer and the interlayer dielectric layer.

8. The method of manufacturing an OLED display panel according to claim 7, wherein a material of the gate metal layer is molybdenum, and the material constituting the gate buffer layer is molybdenum oxide.

9. The method of manufacturing an OLED display panel according to claim 7, wherein the interlayer dielectric layer comprises a first interlayer dielectric layer and a second interlayer dielectric layer, and wherein a material of the first interlayer dielectric layer is silicon oxide, the second interlayer dielectric layer is positioned on the first interlayer dielectric layer, and a material of the second interlayer dielectric layer is silicon nitride.

10. The method of manufacturing an OLED display panel according to claim 7, wherein the gate buffer layer has a thickness of 2 to 5 nm.

* * * * *